United States Patent [19]

Nickel et al.

[11] Patent Number: 5,835,003
[45] Date of Patent: Nov. 10, 1998

[54] COLOSSAL MAGNETORESISTANCE SENSOR

[75] Inventors: Janice Nickel, Belmont, Calif.; Shufend Zhang, Tuxedo, N.Y.

[73] Assignee: Hewlett-Packard Company, Palo Alto, Calif.

[21] Appl. No.: 826,535

[22] Filed: Apr. 2, 1997

Related U.S. Application Data

[63] Continuation of Ser. No. 536,892, Sep. 29, 1995, abandoned.

[51] Int. Cl.$^6$ .................................................. H01L 43/00
[52] U.S. Cl. ................... 338/32 R; 360/113; 324/207.21
[58] Field of Search ............................. 338/32 R, 32 H; 360/113; 324/207.21

[56] References Cited

U.S. PATENT DOCUMENTS

| | | | |
|---|---|---|---|
| 4,949,039 | 8/1990 | Grunberg | 324/252 |
| 5,134,533 | 7/1992 | Friedrich et al. | 360/113 |
| 5,251,088 | 10/1993 | Coutellier et al. | 360/113 |
| 5,343,422 | 8/1994 | Kung et al. | 360/113 |
| 5,411,814 | 5/1995 | Jin et al. | 338/32 R |
| 5,432,373 | 7/1995 | Johnson | 360/113 |
| 5,461,308 | 10/1995 | Jin et al. | 324/117 R |
| 5,475,550 | 12/1995 | George | 360/113 |
| 5,508,867 | 4/1996 | Cain et al. | 338/32 R |

OTHER PUBLICATIONS

Daughton, "Magentoresistive memory technology", Thin Solid Films, V216, pp. 162–168 (1992).

Mark Johnson, Spin Accumulation in Gold Films, Apr. 5, 1993, Physical Review Letters, vol. 70, No. 14, pp. 2142–2145.

Thomas C. Anthony and James A. Burg, "Magnetoresistance of Symmetric Spin Valve Structures", IEEE Transaction on Magnetics, Nov., 1994, vol. 30, No. 6, pp. 3819–3821.

Thomas C. Anthony, Steven L. Naberhuis, James A. Brug, Manoj K. Bhattacharyya, Lung T. Tran, Victor W. Hesterman, and Gerald G. Lopatin, "Dual Stripe Magnetoresistive Heads for High Density Recording", IEEE Transactions on Magnetics, vol. 30, No. 2, Mar. 1994, pp. 303—307.

Ching Tsang, Robert E. Fontana, Tsann Lin, D. E. Heim, Virgil S. Speriosu, Bruce A. Gumey, & Mason L. Williams, "Design, Fabrication & Testing of Spin–Valve Read Heads for High Density Recording", IEEE Transactions on Magnetics, vol. 26, pp. 1689–1691 (1990).

*Primary Examiner*—Michael L. Gellner
*Assistant Examiner*—Karl Easthom
*Attorney, Agent, or Firm*—Denise A. Lee

[57] ABSTRACT

The present invention provides a colossal magnetoresistant sensor, and in particular a colossal magnetoresistant sensor capable of responding to the low fields emanating from the recording media. The recording media typically emanates a low field on the order of 20 Oe which is insufficient to result in a significant change in resistance in a CMR layer of material. The colossal magnetoresistant sensor is comprised of a first magnetic layer; a colossal magnetoresistant layer and a second magnetic layer, where the colossal magnetoresistant layer is positioned between the first magnetic layer and a second magnetic layer. The first and second magnetic layers surrounding the colossal magnetoresistant layer control the field through and therefore the resistance of the CMR layer. When the orientation of magnetization of the first and second magnetic layer are aligned parallel, the fields from the first magnetic layer and second magnetic layer add constructively to produce the large field needed (on the order of 5 Tesla) to produce a low resistance state. When the orientation of magnetization of the first field and the second field are aligned antiparallel, the fields from the first magnetic layer and the second magnetic layers add destructively to produce a high resistance state.

10 Claims, 5 Drawing Sheets

COLOSSAL MAGNETORESISTANCE SENSOR

CROSS-REFERENCE TO RELATED APPLICATION(S)

This is a continuation of copending application Ser. No. 08/536,892 filed on Sep. 29, 1995, now abandoned.

BACKGROUND OF THE INVENTION

The present invention relates generally to devices for sensing a magnetic field and more particularly to magnetic field sensors utilizing colossal magnetoresistant materials.

Magnetic read heads have historically utilized inductive technology to read back the data stored magnetically on a disk. Induction is the consequence of Faraday's law, where a current is induced in a coil when the magnetic flux within the loop changes. Mathematically $V=-\delta\Phi/\delta t$ where V is the electromotive force induced by the time derivative of the magnetic flux, $\Phi$.

As the aerial density of recording media increases, the bit size of the recording media decreases proportionally requiring increased sensitivity of magnetic read heads utilized in readback of the data. Increasing the signal strength of an inductive read head requires increasing the time derivative of the magnetic flux. Thus to increase the signal with decreasing bit size, magnetic read heads have to be flown very fast and in close proximity to the hard disk surface. These flying constraints introduce problems with tribology and increase the probability of head crashing resulting in data loss.

Magnetic read heads utilizing anisotropic magnetoresistant (AMR) materials solve some of the problems of inductive read heads. The resistance of AMR materials changes with the application of a magnetic field. In contrast to conventional inductive read heads which rely on a change in magnetic flux, magnetic read heads utilizing anisotropic magnetoresistant materials rely on a change in value of the magnetic field to change the resistance and thus the measured sensor signal. A change in resistance of about two percent has been observed at room temperature.

In comparison to inductive read heads, AMR read heads offer increased sensitivity. In addition, the time derivative requirement for signal strength is removed for AMR read heads, thus both the flying height and velocity restrictions are relaxed. Further in inductive heads, both the read and write functions are performed by the same coil, thus inductive heads may not be optimized for each specific function. In contrast, AMR heads allow a separation and optimization of the read and write functions.

While the magnitude of the magnetoresistance effect is approximately two percent in AMR materials, the magnitude of the magnetoresistance effect in spin valves associated with giant magnetoresistant materials is about ten percent in optimum wafers. Read heads comprised of giant magnetoresistant (GMR) materials (termed spin valves) are currently under development. Although GMR materials provide increased magnetoresistance, spin valve heads require large current densities ($4\times10^7$ A/cm$^2$) to obtain a large signal. Further, the long term stability of the heads under these operating conditions is not known. In addition, while anisotropic (AMR) and giant (GMR) magnetorestive technologies both will support the aerial density increases expected for several years, their utility is limited by the required track width of the head. Two dimensional modeling shows that the signal decreases with the decreasing track width; and when the track width reaches about 0.5 um, the deterioration of signal increases by about 40%.

Other magnetoresistant materials currently being studied are colossal magnetoresistance (CMR) materials. FIG. 1 shows the resistivity characteristics of a colossal magnetoresistant material as a function of temperature at two different magnetic fields. Curve 102 is representative the resistance of the CMR material at a field of approximately 5 Tesla. Curve 104 is representative of the resistance of the CMR material of a field of approximately 0 Tesla. Curve 106 is representative of $\Delta R/R$ of a given CMR material for a given temperature. Referring to FIG. 1, a large change in the resistivity of the CMR material at room temperature requires application of a large field. For example, application of a 5 Tesla field at room temperature results in a $\Delta R/R$ greater than 90% relative to the zero field value. Because the field emanating from the recording media is so small, in the range of 20 Oersteds, the required application of such a large field (5 Tesla) to significantly change the resistance of the CMR material would seem to be an insurmountable impediment for the utilization of CMR materials in the recording industry.

A CMR sensor which is capable of responding to the low fields generated by recording media is needed. The colossal magnetoresistance sensor should allow production of smaller read heads, with higher sensitivity than currently commercially available.

SUMMARY OF THE INVENTION

The present invention provides a colossal magnetoresistant sensor, and in particular a colossal magnetoresistant sensor capable of responding to the low fields emanating from the recording media. The recording media typically emanates a low field on the order of 20 Oe, which is insufficient to result in a significant change in resistance in a CMR layer of material. The colossal magnetoresistant sensor is comprised of a first magnetic layer; a colossal magnetoresistant layer and a second magnetic layer, where the colossal magnetoresistant layer is positioned between the first magnetic layer and a second magnetic layer. The first and second magnetic layers surrounding the colossal magnetoresistant layer control the field penetrating through, and therefore the resistance of, the CMR layer. When the orientation of magnetization of the first and second magnetic layer are aligned parallel, the fields from the first magnetic layer and second magnetic layer add constructively to produce the large field needed (on the order of 5 Tesla) to produce a low resistance state. When the orientation of magnetization of the first field and the second field are aligned antiparallel, the fields from the first magnetic layer and the second magnetic layers add destructively to produce a high resistance state.

The first and second magnetic layers are comprised of magnetic materials differing in their coercivity where coercivity is defined as the field at which magnetization changes orientation. The material comprising the first magnetic layer has a coercivity less than the fields to be detected. The material comprising the second magnetic layer has a coercivity greater than the coercivity of the first magnetic layer, as well as a coercivity greater than the fields to be detected. The large fields required to bring about substantial changes in resistance in the CMR layer result from the fields of the first and second magnetic layers surrounding it.

The low coercivity magnetic material, the first magnetic layer, is the actual sense layer. The first magnetic layer has a coercivity on the order of 10's of Oersteds, thus the direction of orientation of the first magnetic layer can be reversed by the fields emanating from the magnetic recording media. When the orientation of magnetization of the first magnetic layer is antiparallel to the orientation of magnetization of the second magnetic layer, the fields from the first magnetic layer and second magnetic layer add destructively in the CMR layer resulting in a small field and a high resistance state. When the orientation of magnetization of the first magnetic layer and the second magnetic layer are aligned parallel, the fields from the first magnetic layer and second magnetic layer add constructively in the CMR layer providing a large field and a low resistance state. The field generated by the aligned parallel configuration must be sufficient to change the resistance of the CMR layer, preferably on the order of 5 Tesla or greater at room temperature.

While the inventors do not wish to be bound by the theory, it is believed that at least part of the advantageous result of the invention are obtained by the effects of large exchange fields. Thus preferably, the first and second magnetic layers are comprised of materials having a large exchange field. Thus, the large field is applied to the CMR layer is in part due to the exchange fields from the first and second magnetic layers. Theoretically, the fields produced inside the thin CMR layer can be on the order of five Teslas at the center of the CMR mateial, and much greater at the edges, and thus provide a sufficiently high magnetic field to see a change in resistance on the order of 90%. Further, because the first magnetic layer is comprised of a material having a low coercivity, the CMR sensor is able to respond to the low fields emanating from the magnetic recording media.

The CMR sensor offers increased sensitivity compared to inductive and anisotropic read heads. CMR films having a ΔR/R of approximately 95% at room temperature have been compared to GMR films having a ΔR/R of approximately 20% at room temperature. Thus a magnetic field CMR sensor offers a 475% increase in sensitivity providing significantly higher data storage densities.

A further understanding of the nature and advantages of the present invention may be realized by reference to the remaining portions of the specification and the attached drawings.

DETAILED DESCRIPTION OF THE PREFERRED EMBODIMENTS

Figure 1:
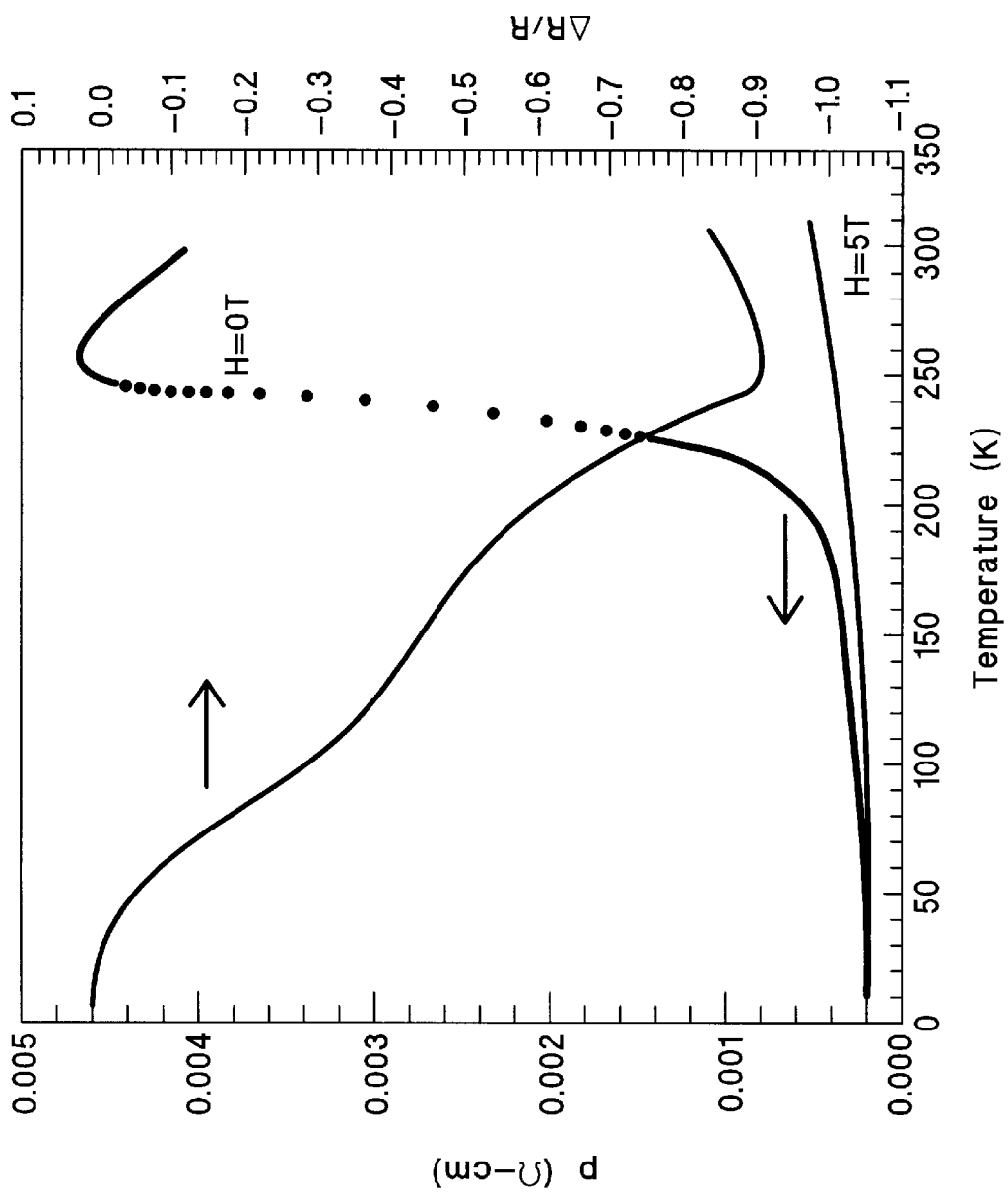
FIG. 1 shows a graphical representation of an applied magnetic field versus resistance for a CMR material at room temperature.
Figure 2:
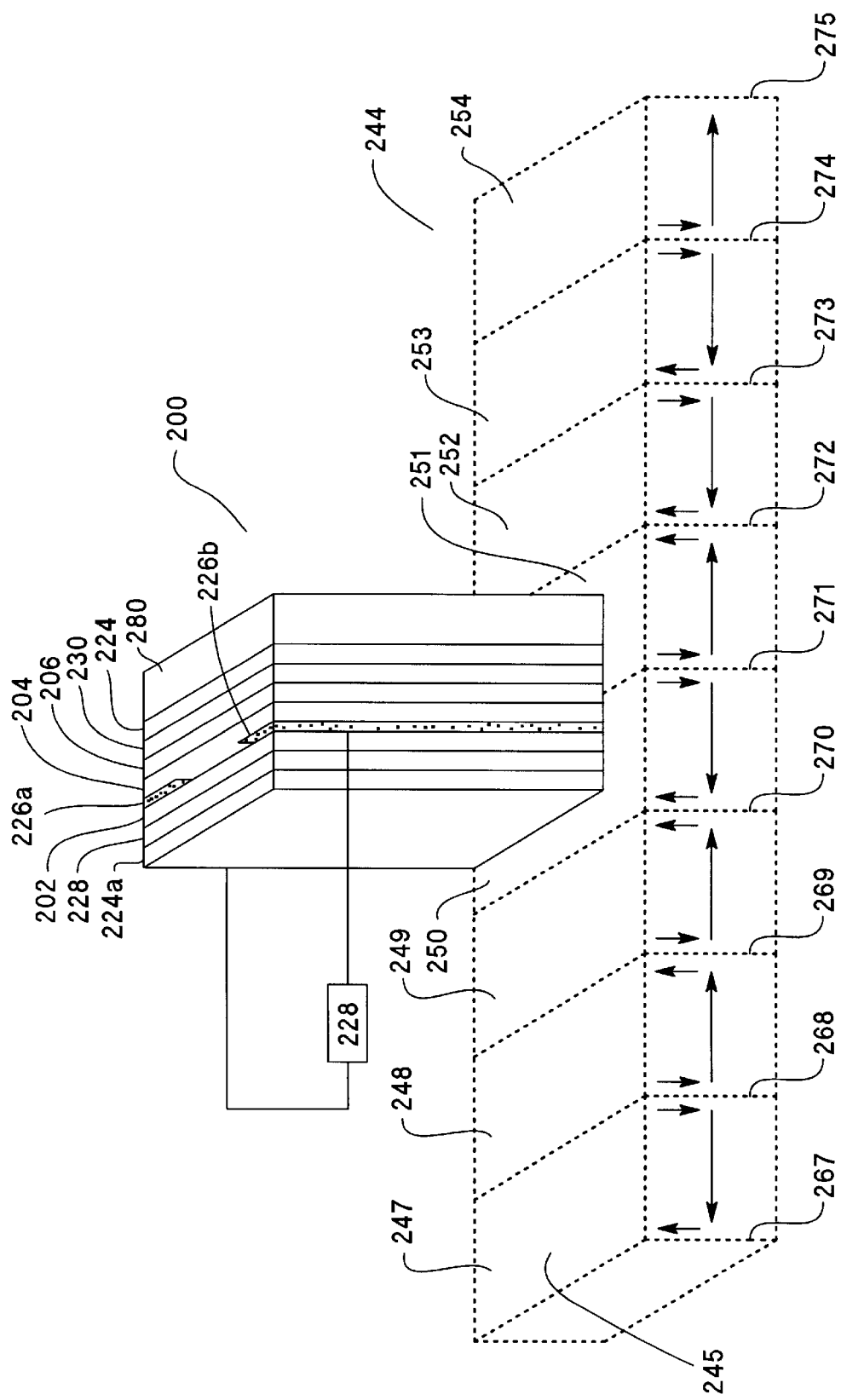
FIG. 2 is a magnetic sensing system utilizing the CMR sensor of the present invention.
Figure 3B:
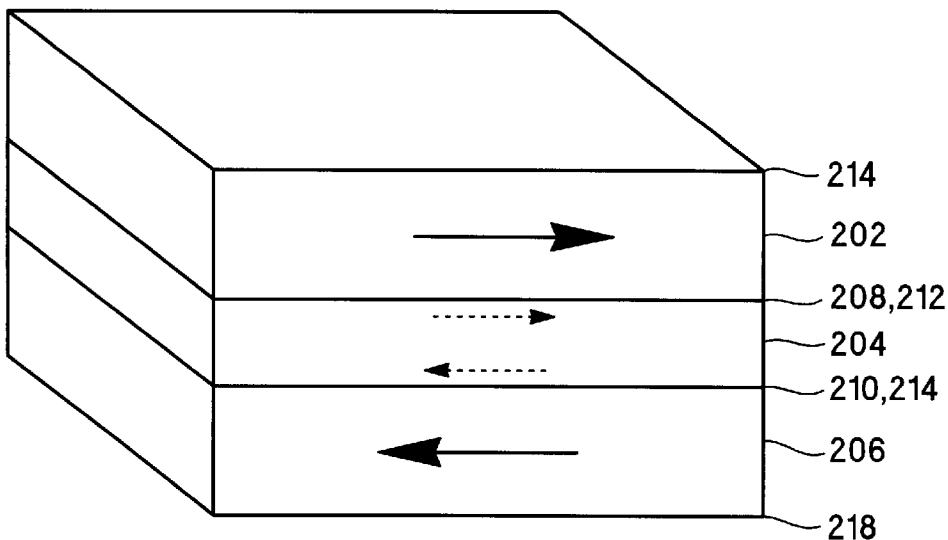
FIG. 3B is a schematic representation of the active region of a CMR sensor according to the preferred embodiment of the present invention where the orientation of magnetization of the first magnetic layer and second magnetic layer are aligned antiparallel.
Figure 3A:
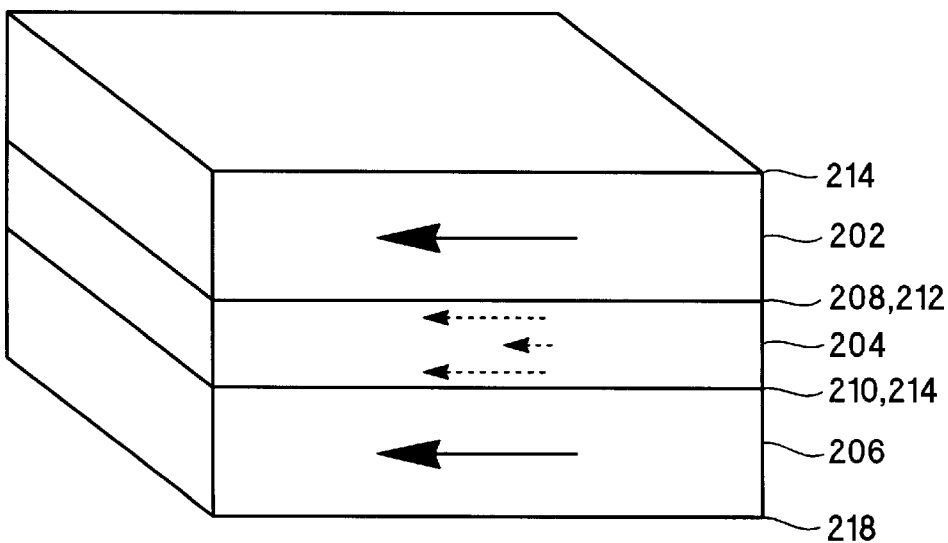
FIG. 3A is a schematic representation of the active region of a CMR sensor according to the preferred embodiment of the present invention where the orientation of magnetization of the first magnetic layer and second magnetic layer are aligned parallel.

FIG. 2 is a magnetic sensing system utilizing the CMR sensor 200 of the present invention. FIGS. 3A and 3B show a cross sectional view of the active region 201 of a colossal magnetoresistant sensor capable of sensing the low fields typically emanating from recording materials according to the preferred embodiment of the present invention. The active region 201 of the CMR sensor 200 includes a first magnetic layer 202, a colossal magnetoresistant layer 204 and a second magnetic layer 206, where the colossal magnetoresistant layer 204 is positioned between the first magnetic layer 202 and the second magnetic layer 204.

Preferably, and as seen in FIGS. 3A and 3B, the CMR layer 204 is positioned adjacent to and contacting the first and second magnetic layers 202, 206. In embodiment shown in FIG. 2, the CMR layer 204 has a first major surface 208 and a second major surface 210. Similarly, the first and second magnetic layers 202, 206 have a first major surface 212, 214 and a second major surfaces 216,218. In FIG. 3, at least a portion of a first major surface 208 of the CMR layer is adjacent to the first major surface 212 of the first magnetic layer 202 and at least a portion of the second major surface 210 of the CMR layer 204 is positioned adjacent to the first major surface 214 of the second magnetic layer 206.

Other embodiments of the active region 201 besides the structure shown in FIG. 3 where the CMR layer is positioned between a first magnetic layer and a second magnetic layer are possible. For example, in an alternative embodiment, a layer of material is positioned between the first magnetic layer and the CMR layer or alternatively between the second magnetic layer and the CMR layer. The layer or layers of material should be thin enough to allow the field of the first magnetic layer or alternatively the second magnetic layer to penetrate at least a portion of the CMR layer. FIG. 4D shows an alternative embodiment where a layer 282 is positioned between the CMR layer 204 and the first magnetic layer 202. Similarly in FIG. 4D, a layer 284 is positioned between the CMR layer 204 and the second magnetic layer 206.

In the preferred embodiment of the present invention, the resistance of the first magnetic layer 202 and the second magnetic layer 206 is greater than the resistance of the colossal magnetoresistant layer 204, and preferably significantly greater so that current will flow predominantly through the colossal magnetoresistant layer 204. The coercivity of the second magnetic layer 206 should be higher than the coercivity of the first magnetic layer 202. Further, the coercivity of the first magnetic layer 202, the sense layer, should be less than the magnetic field emanating from the magnetic recording material.

Figure 5:
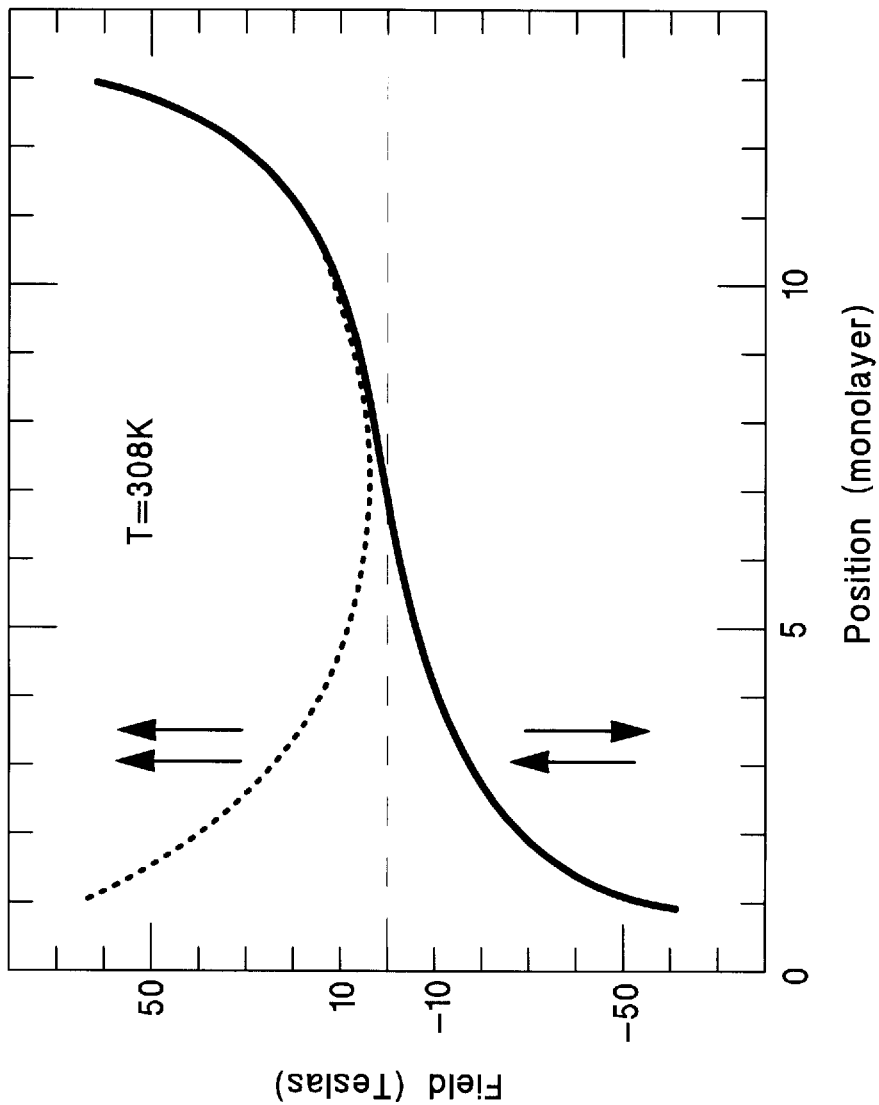
FIG. 5 shows a graphical representation of the exchange field versus position in a CMR layer at room temperature according to the preferred embodiment of the present invention.

While the inventors do not wish to be bound by the theory, it is believed that at least a part of the advantageous results of the invention are obtained by the effects of large exchange fields. Thus preferably the first and second magnetic layers 202, 206 are comprised of materials having large exchange fields. Referring to FIG. 5 shows a graphical representation of the exchange field versus position in the CMR layer 204 at room temperature according to the preferred embodiment of the present invention. Typically, the exchange fields of the first magnetic layer 202 and the second magnetic layer 206 decrease exponentially in the CMR material 204 and combine to reach values of greater than 5 Tesla to 10 Tesla in the center of a 15 monolayer thick CMR layer 204.

Insulators are defined as materials where the resistivity increases with decreasing temperature. Metals are defined as a material whose resistivity decreases with decreasing temperature. Colossal magnetoresistant materials may be defined as materials which undergo an insulating to metal transition and exhibit magnetoresistance, a change in resistance when subjected to a magnetic field, in the metallic state. Colossal magnetoresistant materials are typically single phase, single composition materials whose resistance changes in response to an applied magnetic field. Theoretically this change in resistance in response to a change in the magnetic field is due to changes in the metal-oxygen-metal bond angles which cause changes in the hopping frequency of electrons from one metal ion to the next metal ion. Colossal magnetoresistant materials include materials in the form $Ln_{1-y}M_yXO_3$ (Ln—M—X oxides) where Ln is La or Y, M is Ba, Sr, Ca, Pb, X is Mn or Co, and y is typically between 0 and 0.5 and is preferably 0.33. Although these materials are believed to produce CMR materials, other materials not listed are also possible. Known CMR materials typically require high fields, in the range of 1 Tesla to 7 Tesla to see a significant change in resistance.

Although, the stoichiometry and constituent elements of the colossal magnetoresistant materials used in the CMR layer 204 may vary, currently Applicants believe the preferred material to be $La_{0.67}ME_{0.33}MnO_4$ where ME is Ca, Sr, or Ba. The best results thus far have been seen in Sr and Ca materials, thus Sr and Ca are preferred. The resistivity of $La_{0.67}ME_{0.33}MnO_4$ varies dependent upon its growth conditions but is typically between 2 mohm-cm and 20 ohm-cm. The CMR layer 204 is preferably thin, typically between 50–100 Angstroms, so that the exchange fields penetrating the CMR layer 204 from the neighboring first and second magnetic layers 202, 206 are very large throughout a majority of the CMR layer. The thickness of the CMR layer 204 can be varied experimentally to determine the optimum thickness.

The first and second magnetic layers 202, 206 may be comprised of any one of a number of magnetic materials (including ferromagnetic and ferrimagnetic materials) having a high resistivity compared to the CMR layer 204 and the required coercivity. Preferably, the materials of which the first and second magnetic layers 202, 206 are comprised of magnetic materials having large exchange fields.

The first magnetic layer has a required coercivity lower than the magnetic field emanating from the recording media. The spinel ferrites, $MEFe_2O_4$, where ME is a divalent transition metal, are ideal for use as the first magnetic layer due to their weak coercivity. Preferably, a spinel ferrite such as $CoFe_2O_4$, may be used as the material for the first magnetic layer 202. The coercivity of $CoFe_2O_4$ decreases as one substitutes $Fe^{2+}$ for Co. After magnetic annealing, a 2% $Fe^{2+}$ sample typically has $H_c$ approximately equal to 50 Oe.

The coercivity of the first magnetic layer 202, the sense layer, is typically in the range of 10 to 50 Oe and may be easily changed by the fields emanating from the recording media. The thickness of the first magnetic layer 202 is typically in the range of 20 to 200 Angstroms. The resistivities of the first magnetic layer 202 is typically in the range $10^2$ to $10^7$ ohm-cm, depending on composition, heat treatment and sintering atmosphere. Thus, the resistivity of the first magnetic layer 202 is orders of magnitude larger than the CMR resistance resulting in current flow through the CMR layer 204. Although typical ranges for coercivity, thickness and resistivity of the first magnetic layer are given, the coercivity, thickness and resistivity of the first magnetic layer may be adjusted if optimization of the sensor is needed.

Since the low coercivity layer is the sense layer, it requires a large permeability which goes as the saturation magnetization divided by the anisotropy. Substituting Zn for Co increases the saturation magnetization of the first magnetic layer 202. Since the properties of mixed spinel ferrites are linearly dependent on the composition, and since the anisotropy of spinel ferrites can be both positive and negative, compositions could be obtained that have anisotropies near zero.

The second magnetic layer 206 has a coercivity larger than the coercivity of the field emanating from the magnetic recording media in which the change in magnetic field is sensed and a resistance higher than the resistance of the material used for the CMR layer 204. In the preferred embodiment, hexagonal ferrite materials are used for the second magnetic layer 206. Hexagonal ferrites are attractive because of their high magnetocrystalline anisotropy (order of $10^6$ erg/cm$^3$) and their high coercivity (kOe). Further, the resistivities of hexagonal ferrite materials are quite high, on the order of approximately 100 ohm-cm which is at least several orders of magnitude larger than typical CMR materials.

For lattice matching to the CMR materials, the c-axis of the hexagonal structure is normal to the growth plane. This requires finding a hexagonal ferrite with the easy axis of magnetization in the plane perpendicular to the c-axis. There are six chemically distinct genres of hexagonal ferrites, two of which have easy axes of magnetization perpendicular to the c-axis. The two genres of hexagonal ferrites having easy axes of magnetization perpendicular to the c-axis are $ME_2Ba_2Fe_{12}O_{22}$ (designated $ME_2Y$ where ME is a divalent transition metal) and $ME_2Ba_3Fe_{24}O_{41}$ (or $ME_2Z$), thus either of these two genres of hexagonal ferrites could be used for the second magnetic layer 206. In the preferred embodiment, the second magnetic layer is $Co_2Z$ which has a remnant magnetization (perpendicular to c-axis) of approximately 3000 Gauss.

The coercivity of the second magnetic layer 206 is typically in the range of 0.5 to 5 kOe and should be larger than the fields emanating from the recording media. The thickness of the second magnetic layer 206 is typically in the range of 50 to 200 Angstroms. The resistivities of the second magnetic layer 206 is typically in the range $10^2$ to $10^7$ ohm-cm. Thus, the resistivity of the second magnetic layer 206 is orders of magnitude larger than the CMR resistance resulting in current flow through the CMR layer 204. Although typical ranges for coercivity, thickness and resistivity of the second magnetic layer 206 are given, the coercivity, thickness and resistivity of the second magnetic layer 206 may be adjusted if optimization of the sensor is needed.

FIG. 2 shows a magnetic sensor system utilizing a CMR sensor 200 according to the preferred embodiment of the present invention. Although not required for sensor functionality, the CMR sensor shown in FIG. 2 includes shields 224a, 224b. For recording media applications, the magnetic sensor typically must be shielded to provide the required resolution. The shields 224a, 224b are comprised of high permeability materials and should preferably surround on two sides the active region of the sensor. The shields absorb the stray flux from adjacent transitions so that the sensor only detects fields from the transition directly below it.

Figure 4B:
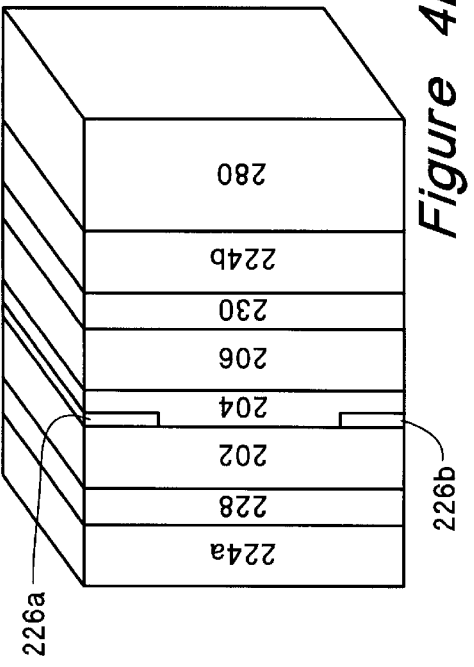
FIG. 4B is a partial schematic representation of the CMR sensor according to a second embodiment of the present invention.
Figure 4C:
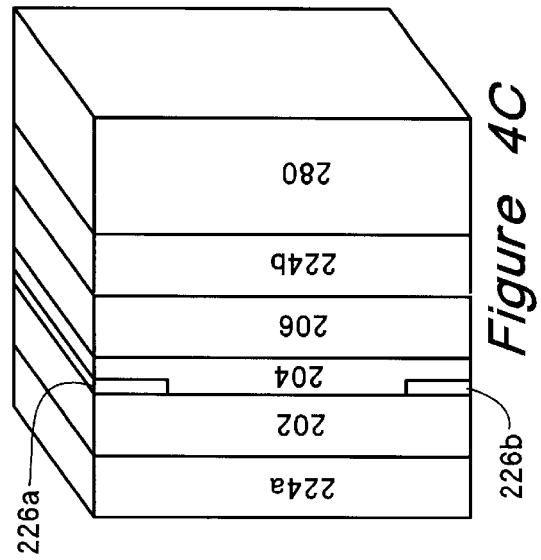
FIG. 4C is a partial schematic representation of the CMR sensor according to a third embodiment of the present invention.
Figure 4A:
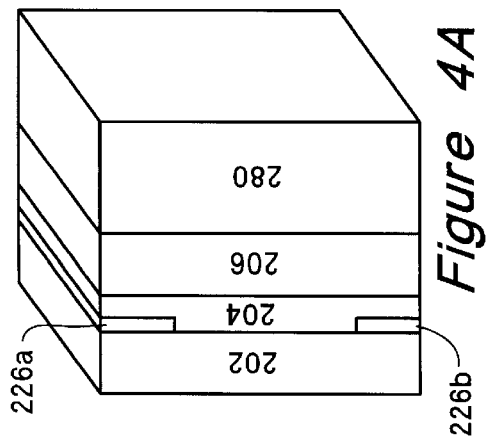
FIG. 4A is a partial schematic representation of the CMR sensor according to a first embodiment of the present invention.
Figure 4D:
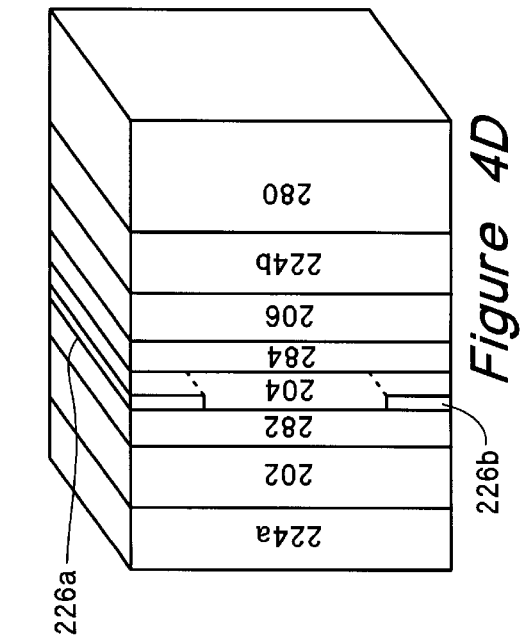
FIG. 4D is a partial schematic representation of the CMR sensor according to a fourth embodiment of the present invention.

Referring to FIG. 4A, 4B, 4C, and 4D shows partial schematic representations of the CMR sensor according to different embodiments of the present invention. The CMR sensor does not include shields 224. Current leads 226a, 226b are connected to a current source 228 (not shown in FIG. 4A). FIG. 4B is the representation of the CMR sensor corresponding to the sensor system shown in FIG. 2. The partial representation of the CMR sensor includes shields 224a, 224b which are separated from magnetic layers 202 and 206 by insulating layers 228 and 230. The insulating layers 228 and 230 are typically a material such as $Al_2O_3$ having a thickness in the range of 500 to 1000 Angstroms. FIG. 4C is a representation of a CMR sensor having shields 224a and 224b but no insulating layers. The embodiment shown in FIG. 4C is typically used when magnetic layers 202 and 206 are insulating since the shield layers 224a and 224b are typically conductive. Also to compensate for the lack of insulating layers 228, the thickness of the magnetic layers for the embodiment shown in FIG. 4C is increased compared to the thickness of the magnetic layers for the embodiment shown in FIG. 4B. For example, a typical thickness of the second magnetic layer 206 in the embodiment shown in FIG. 4B would be between 100 to 200 Angstroms while a typical thickness of the second magnetic layer for the embodiment shown in FIG. 4C would be in the range of 400 to 600 Angstroms. Although the thickness of the second magnetic layer is not critical, the thickness of the second magnetic layer should be sufficient to prevent tunneling current to the magnetic shield layers 224a, 224b.

Referring to FIG. 2, the sensor 200 is positioned over a magnetic recording media 244 which is typically a ferromagnetic material having magnetic domains written therein. The magnetic domains 247–254 shown in FIG. 2 have a major magnetization orientation parallel to the surface 245 of the magnetic media 244. Between magnetic domains 247–254 are domain walls 267–275. The sensor 200 moves above the magnetic media 244 so as to intercept the magnetic fields emanating from the magnetic media. The fields emanating from the magnetic material 244 must be sufficient to change the orientation of the first magnetic layer 202.

The large fields necessary to change the orientation of the magnetic moments in the CMR layer 204 are believed to be applied to the CMR layer 204 through the exchange fields of the first magnetic layer 202 and the second magnetic layers 206 surrounding it. In the present invention, the first magnetic layer 202 is comprised of a low coercivity magnetic material and acts as the actual sense layer. As the orientation of the magnetization of the first magnetic layer 202 is rotated relative to the second magnetic layer 206, the changing effective exchange fields penetrating the CMR material will affect the resistivity of the CMR layer and thus will affect the resistivity of the sensor.

The configurations for the low and high resistance states of the CMR sensor 200 can be more clearly seen in FIGS. 3A and 3B. The large field is applied to the CMR layer via the exchange fields from the magnetized ferrite layers. FIG. 3A is a cross sectional view of active region of the CMR sensor according to the preferred embodiment of the present invention where the orientation of magnetization of the first magnetic layer 202 and second magnetic layer 206 are aligned parallel. When the orientation of magnetization of the two magnetic layers 202, 206 are aligned parallel, the exchange fields from the first and second magnetic layers 202,206 add constructively in the CMR layer providing a single domain state and a large effective field and thus a low resistance state. The effective fields produced inside a thin CMR layer can be on the order of Teslas.

FIG. 3B is a cross sectional view of the active region of the CMR sensor 200 according to the preferred embodiment of the present invention where the orientation of magnetization of the first magnetic layer and second magnetic layer are aligned antiparallel. When the direction of the magnetization of the first magnetic ferrite layer is switched form the orientation shown in FIG. 3A, the orientation of magnetization of the first magnetic layer 202 is antiparallel to the orientation of magnetization of the second magnetic layer 206. In this case, the exchange fields from the first and second magnetic layers 202, 206 will nearly cancel at the center of the CMR material, leaving a very small field in the center of the CMR layer. This configuration separates the CMR material into smaller domains or clusters, thus increasing the resistivity of the entire layer and giving a high resistance state. The coercivity of first magnetic layer 202 is on the order of 10's of Oersteds, thus the direction of the soft ferrites magnetization can be reversed by fields emanating from the magnetic recording media.

The sensor configurations described will work for CMR materials sandwiched between any two highly resistive, magnetic layers (one with a high coercive and the other with a low coercive field). It is believed that the second magnetic layer 206 can be either a ferromagnetic or ferrimagnetic material. The ferrite system used in the second magnetic layer 206 is just one possible example. The sensor structure will also act as a magnetic switch, with very little conductivity for the magnetization of the ferrites aligned antiparallel and very high conductivity when the magnetization of the ferrites are aligned parallel. Other possible applications for a magnetic switch would be in a solid state relay or solenoid.

For a high resistance state, and as shown in FIG. 3B, the orientation of magnetization of the first magnetic layer is antiparallel, or oriented 180 degrees with respect to the orientation of magnetization of the second magnetic layer. For the low resistance shown in FIG. 3A, the orientation of magnetization is in parallel, or oriented zero degrees with respect to the orientation of magnetization of the second magnetic layer. However, in alternative configurations the value of the angle between the orientations of the first and second magnetic layers may be some intermediate value, between the zero and 180 degree values, for example 45 degrees.

The method of making the colossal magnetoresistant sensor includes the steps of: forming a first magnetic layer; and forming a colossal magnetoresistant layer between the first magnetic layer and a second magnetic layer, wherein the first magnetic layer and second magnetic layer have a resistance higher than the resistance of the colossal magnetoresistant layer, wherein the coercivity of the second magnetic layer is greater than the coercivity of the first magnetic layer. Although, the order of forming the first, second and colossal magnetoresistant layers is not critical, Applicant believes the preferred method of making the sensor would be to first form CMR layer on the second magnetic layer, followed by the step of forming the first magnetic layer on the CMR layer.

The second magnetic layer 206 is typically grown on a substrate 280 using thin film deposition techniques such as chemical vapor deposition, molecular beam epitaxy, sputtering, etc. The substrate may be made of a variety of different materials but is typically a material such as $LaAlO_3$ having a thickness in the range of one to ten mm. The second magnetic layer is preferably a hexagonal ferrite such as $Co_2Z$. The a lattice parameters of the hexagonal ferrites are universally about 5.88 angstroms. This gives a 7% lattice mismatch between the ferrite and the <111> plane of the preferred CMR material, $La_{0.67}Ca_{0.33}MnO_4$.

The lattice parameter of $La_{0.67}Ca_{0.33}MnO_4$ is approximately 3.8 angstroms. The CMR layer 204 is grown along the <111> orientation with the [111] direction normal to the hexagonal second magnetic layer's basal plane. Applicant is not aware of any orientational dependence of CMR materials; however, typical CMR materials are cubic structures and nothing in the known crystal structure would reduce the symmetry. Thus one would expect the orientational dependence to be nearly isotropic. To date, Applicant believes no data has been shown that indicates the magnitude of the effect depends on the relative orientation of the field to the crystallographic axes.

After formation of the CMR layer 204, a first magnetic layer 202 is formed on the CMR layer. The first magnetic layer 202 is preferably a spinel ferrite. The spinel ferrites is preferably grown along the <111> direction to remain lattice matched with the CMR material. The expected lattice mismatch is approximately 9%.

However, lattice matching of the spinel material is not critical since the system will be subjected to a magnetic anneal to set the uniaxial magnetic anisotropy along the direction parallel to the interfaces between the layers. In the Co—Zn—Fe—O system, it was found that the direction of the magnetic field (while cooling through $T_c$) becomes the easy direction of magnetization for the uniaxial anisotropy, irrespective of the direction of this field with regard to the axis of the crystal. Thus epitaxial material is most likely not required.

Current leads 226a, 226b are electrically coupled to the CMR layer 204 to detect current. Current leads 226 are formed using techniques well known in the art. Typically, leads 226i a, 226b are deposited either after deposition of the second magnetic layer 206, or after the deposition of the CMR layer 204.

For recording media applications, the magnetic sensor must be shielded to provide the required resolution. For example, in the embodiment shown in FIG. 4B, the method of making the magnetic sensor further includes the steps of forming an insulating layer, and forming a shielding layer. For the embodiment shown in FIG. 4C, the method of making the magnetic senor further includes the step of forming a shielding layer. Shielding layer and insulating layer formation are performed using techniques well known in the art. For magnetic recording applications the sensor is typically grown between the shields. A seed layer may be required to get epitaxial growth of the second magnetic layer 206.

It is understood that the above description is intended to be illustrative and not restrictive. For example, in the preferred embodiment the CMR layer is positioned between the first magnetic layer and the second magnetic layer. However, other alternative embodiments are possible. What is important is that the colossal magnetoresistant material is positioned so that it is effected by both the first magnetic layer and the second magnetic layer so that additions of effects of both fields in the colossal magnetoresistant material result in a high resistance state and a low resistance state. Further, preferably the CMR layer is comprised of a single colossal magnetoresistant material, however the CMR layer could be comprised of a plurality of layers of different CMR materials. Similarly, the first and second magnetic layers could be comprised of a plurality of layers of different magnetic materials having the required resistive and coercive properties. The scope of the invention should therefore not be determined with reference to the above description, but instead should be determined with reference to the appended claims, along with the full scope of equivalents to which such claims are entitled.

What is claimed is:

1. A device for sensing a magnetic field, comprising:

a first magnetic layer;

a magnetoresistant layer, the magnetoresistant layer being comprised of a material which undergoes an insulating to metal transition and exhibits magnetoresistance in the metallic state, the magnetoresistant layer positioned between the first magnetic layer and a second magnetic layer, wherein the resistance of the first magnetic layer is greater than the resistance of the magnetoresistant layer, wherein the thickness of the magnetoresistant layer is greater than the spin depth of the magnetoresistant material, and further wherein the coercivity of the second magnetic layer is higher than the coercivity of the first magnetic layer; and a first current lead and a second current lead, the first and second current leads being electrically coupled to the magnetoresistant layer.

2. The device recited in claim 1 wherein the magnetoresistant layer has a first major surface and an opposite second major surface, wherein the orientation of magnetization of a first major surface of the second magnetic layer is substantially parallel to the plane of the first major surface of the magnetoresistant layer.

3. The device recited in claim 1 wherein responsive to a magnetic field having an absolute value greater than the coercivity of the first magnetic layer, the orientation of magnetization of the first magnetic layer changes.

4. The device recited in claim 1 wherein the thickness of the colossal magnetoresistant layer is such that the exchange coupling field of the first magnetic layer and the exchange coupling field of the second magnetic layers both penetrate at least a portion of the colossal magnetoresistant layer.

5. The device recited in claim 1 wherein the magnetic field emanating from the magnetic recording media is less than the coercivity of the second magnetic layer.

6. The device recited in claim 1 wherein the magnetic field is sensed at room temperature.

7. The device recited in claim 1 wherein the orientation of magnetization of the first magnetic layer being substantially parallel to the orientation of magnetization of the second magnetic layer results in a low resistance state in the magnetoresistant layer.

8. The device recited in claim 1 wherein the orientation of magnetization of the first magnetic layer being substantially anti-parallel to the orientation of the second magnetic layer results in a high resistance state in the magnetoresistant layer.

9. The device recited in claim 1 wherein the first magnetic and second magnetic layers have large exchange fields.

10. The device recited in claim 1, wherein responsive to application of a voltage between the first current lead and the second current lead, a current flows generally parallel to a boundary formed by the first magnetic layer and the magnetoresistant layer.

* * * * *